United States Patent [19]
Nixon

[11] Patent Number: 6,111,760
[45] Date of Patent: Aug. 29, 2000

[54] SIMPLE ENCLOSURE FOR ELECTRONIC COMPONENTS

[75] Inventor: Patrick Edward Nixon, Raleigh, N.C.

[73] Assignee: Ericsson, Inc., Research Triangle Park, N.C.

[21] Appl. No.: 09/223,675

[22] Filed: Dec. 30, 1998

[51] Int. Cl.[7] .............................. H04B 1/38; H04M 1/00; H05K 5/02

[52] U.S. Cl. ......................... 361/814; 361/752; 361/801; 361/807; 455/90; 379/433; 220/4.02

[58] Field of Search ..................................... 361/752, 753, 361/759, 792, 796, 797, 801, 810, 807, 814; 455/90; 347–351; 379/428–440; D13/103; 220/4.02, 682

[56] References Cited

U.S. PATENT DOCUMENTS

| | | | |
|---|---|---|---|
| 4,912,602 | 3/1990 | Zurek et al. | 361/760 |
| 5,117,330 | 5/1992 | Miazga | 361/752 |
| 5,596,487 | 1/1997 | Castaneda et al. | 361/814 |
| 5,613,237 | 3/1997 | Bent et al. | 361/814 X |
| 5,946,395 | 8/1999 | Petrella et al. | 379/433 |

*Primary Examiner*—Jayprakash N. Gandhi
*Attorney, Agent, or Firm*—Coats & Bennett, P.L.L.C.

[57] ABSTRACT

Multiple layers of electronic components are secured within a wireless communications device, such as a cellular telephone, by gripping the component layers between two different portions of the device's enclosure, thereby preventing substantial vertical movement of the component layers within the combined housing. A first housing section, typically the front portion of the device's shell housing, includes both a first set of holding surfaces and a second set of holding surfaces which are preferably, but not necessarily, lying in two different planes. Preferably, these holding surfaces are portions of fingers that extend downwardly away from the first housing section. When the two housing sections are joined, the first set of holding surfaces directly contacts the lower component layer and presses the same against the second housing section. Likewise, the second set of holding surfaces directly contacts the second component layer and presses the same against the second housing section. In this manner, the first and second component layers are vertically trapped between the first and second housing sections. The two housing portions may be joined in any manner known in the art, such as by screws or ultrasonic welding; but the two housing portions are preferably snap-fitted together using snap teeth on the aforementioned fingers and corresponding recesses in the rear housing portion. In some embodiments, the enclosure described above is adapted to secure additional component layers by adding additional sets of holding surfaces to the appropriate housing section. Such an approach allows for easier and less expensive assembly and may allow for thinner devices to be made.

38 Claims, 5 Drawing Sheets

SIMPLE ENCLOSURE FOR ELECTRONIC COMPONENTS

FIELD OF THE INVENTION

The present invention relates to the field of enclosures for wireless communications devices, and more particularly to an enclosure approach that uses two housing shell components to grip multiple layers of electronic components and prevent vertical movement thereof.

BACKGROUND OF THE INVENTION

Wireless communications devices, such as cellular telephones, are typically portable and are therefore subjected to a wide variety of mechanical vibrations and shocks. Accordingly, such devices must be constructed to withstand mechanically harsh environments without failing due to internal damage, short circuits, or the like. In particular, the electronic components within the device must be secured in place so as to prevent their movement and the resulting damage inside the device. Further, if the wireless communications device includes multiple layers of electronic components, the various layers must in general be held apart so at to prevent various malfunctions such as short circuits and the like.

Typically, electronic components within a wireless communications device are secured in place by either adhesives or screws. For example, an internal battery pack may be secured inside the outer housing by gluing the battery pack to a portion of the housing, such as the rear half of the housing. Or, the printed circuit boards (PCB) within the wireless communications device will be secured to the housing via one or more screws which pass through holes in the PCB. Unfortunately, these and similar methods are less than ideal in that they require additional parts (adhesive or screws), require additional assembly steps (applying the glue or installing the screws), and may increase space requirements.

With the push for smaller, cheaper, and lighter wireless communications devices, there remains a need for an approach for securing electronic components within the wireless communications device that requires fewer parts and, preferably, reduces the complexity of manufacturing.

SUMMARY OF THE INVENTION

The present invention secures multiple layers of electronic components within a wireless communications device, such as a cellular telephone, by gripping the component layers between two different portions of the wireless communications device's enclosure, thereby preventing substantial vertical movement of the component layers within the combined housing. A first housing section, typically the front portion of the device's shell housing, includes both a first set of holding surfaces and a second set of holding surfaces which are preferably, but not necessarily, lying in two different planes. Preferably, these holding surfaces are portions of fingers that extend out away from the first housing section. When the two housing sections are joined, the first set of holding surfaces directly contacts the lower component layer and presses the same against the second housing section. Likewise, the second set of holding surfaces directly contacts the second component layer and presses the same against the second housing section. In this manner, the first and second component layers are vertically trapped between the first and second housing sections. In some embodiments, the enclosure described above is adapted to secure additional component layers by adding additional sets of holding surfaces to the appropriate housing section.

Preferably, the second housing section includes a well having a plurality of peripheral ribs; the first component layer preferably rests at least partially within the well and the ribs help constrain the non-vertical movement of said first component layer. In addition, the first and second holding surfaces preferably include a cushion which directly contacts the respective component layers so as to accommodate manufacturing tolerances.

The two housing portions may be joined in any manner known in the art, such as by screws or ultrasonic welding; but the two housing portions are preferably snap-fitted together using snap teeth on the aforementioned fingers and corresponding recesses in the rear housing portion.

Using the approach of the present invention allows wireless communications devices to include fewer parts while still properly securing their component layers. While screws and the like may optionally be used to join the portions of the enclosure together, screws and the like are not necessary to vertically hold the electronic component layers within the enclosure. Such an approach allows for easier and less expensive assembly and may allow for thinner devices to be made.

DETAILED DESCRIPTION

The present invention captures multiple layers of electronic components between housing sections of a wireless communications device by using two different portions of the wireless communications device's enclosure 10 to grip the component layers and thereby prevent vertical movement of the component layers. For purposes of illustration, a battery pack 80 and a printed circuit board (PCB) 90 will be used as examples of component layers; however, the term "component layers" as used herein is not so limited and instead includes any electronic component or components that are arranged in a layered fashion, even if the layers are not substantially parallel, provided the layers are at least partially overlapping.

Figure 1:
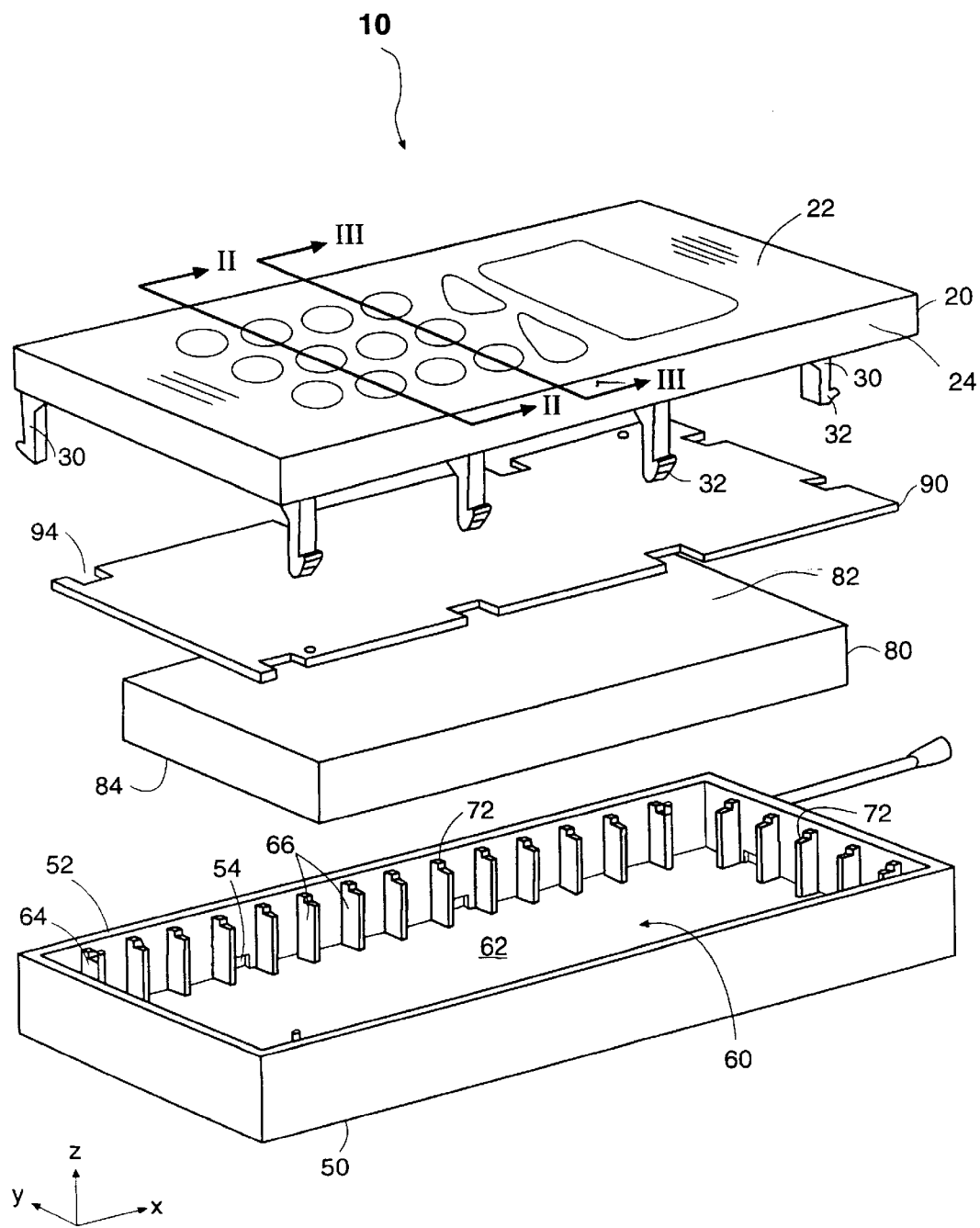
FIG. 1 is a partially exploded perspective view of a cellular telephone enclosure according to the present invention.

An enclosure 10 for a wireless communications device typically includes a front housing 20 and a rear housing 50, typically formed from a polycarbonate-ABS blend, or similar tough and rigid plastic material. The two housing portions 20,50 are joined together to enclose the electronic components of the wireless communications device. For purposes of illustration, the following discussion will assume that the two housing portions 20,50 are joined together by snap-fitting; however, the present invention also encompasses joining the housing portions 20,50 together in any manner known in the art, including by screws, clips, ultrasonic welding, and the like. As used herein, the direction of "vertical" means generally along the z-axis as shown in FIG. 1. For simplicity of discussion only, the positive vertical direction will be assumed to be the direction from the rear housing 50 to the front housing 20.

The front housing 20 is generally a concave body that includes an outer front face 22 and sidewalls 24. For the embodiment shown in FIG. 1, a plurality of downwardly extending fingers 30 extend from the underside of the front housing 20. On the lower portion of each finger 30 is a snap tooth 32. On the finger 30, above the snap tooth 32, are two holding surfaces 34,36. Preferably, these holding surfaces 34,36 are angled with respect to the main axis of the finger 30, so as to be at an angle with respect to the x-y plane as more fully explained below. Collectively, the holding surfaces 34 closer to the snap teeth 32 will be referred to as the first set of holding surfaces 34 and the holding surfaces 36 farther from the snap teeth 32 will be referred to as the second set of holding surfaces 36. Preferably, the first set of holding surfaces 34 are in a first common plane and the second set of holding surfaces 36 are in a second common plane.

Likewise, the rear housing 50 is typically a concave body having sidewalls 52 and a well 60 on the inner side. For the present illustrative example, the sidewalls 52 include appropriate snap recesses 54 disposed about the periphery of the rear housing 50 in locations that correspond to the locations of the snap teeth 32 for accepting and retaining the snap teeth 32 of the front housing 20. The well 60 is defined by the sidewalls 52 and a floor 62. On the periphery of the well 60 are a plurality of support ribs 64,66, typically of two types. The first type of support ribs 64 are located at the corners of where the battery pack 80 will be located. These support ribs 64 extend slightly farther into the well 60 than the second set 66 so as to limit the movement of the battery pack 80 in the X direction. The second type of support ribs 66 are located between the first type of support ribs 64 and typically extend only a short distance into the well 60. The support ribs 66 limit the movement of the battery pack 80 in the Y direction. These support ribs 66 include a plurality of resting surfaces 72, typically horizontal ledges, vertically spaced from the bottom of the well 60. As with the holding surfaces 34, these resting surfaces 72 preferably lie in a third common place vertically spaced from the floor 62. The support ribs 64,66 shown in FIG. 1 are fairly evenly spaced on opposing sidewalls 52. However, the particular spacing arrangement of the support ribs 64,66 is a matter of design choice and any suitable arrangement may be used, including moving the first set of ribs 64 to positions within the string of ribs 66 on a given sidewall 52. However, if such an approach is taken, then the support ribs 64 may no longer limit the movement of the battery pack 80 in the X direction. Further, while it is preferred that the ribs 64,66 extend to the bottom of the well 60, this is not necessary.

The assembly of the enclosure 10 may be easily and straightforwardly carried out. The rear housing 50 is placed well-side up on a flat surface. The battery pack 80 is inserted into the well 60, between the ribs 64,66, such that the X and Y movement of the battery pack 80 is constrained by the ribs 64,66. Preferably, the support ribs 64,66 are in direct contact with the battery pack 80 so to prevent any significant endwise or sideways movement thereof. In this configuration, the battery pack 80 is at least partially, and preferably totally, within the well 60. Next, the battery pack 80 is connected to the PCB 90 via any well known technique, such as by plugging terminating wires associated with the battery pack 80 into surface mount connectors. It is unimportant whether the battery pack 80 is a single cell or multi-cell design or what type of batteries are used. Thereafter, the PCB 90 is inserted into the rear housing 50, preferably so that it rests upon the resting surfaces 72 associated with the ribs 66. It should be noted that it may be advisable to use registration pins, bosses or the like to facilitate proper alignment of the PCB 90 within (or upon) the rear housing 50. Alternatively, the battery pack 80 may be connected to the PCB 90 by any other method known in the art, such as by using surface type deflection type spring connector on the PCB 90 to mate with terminals on the battery pack 80.

Once the PCB 90 is in place, other items as necessary may be attached to the front housing 20 and/or the upper surface 92 of the PCB 90. , such as a display, flexible keypad, and other items well known in the art. The particular details of attachment of these items are well known in the art and discussion of the same is not necessary to understanding the present invention. However, for the embodiment shown in FIGS. 1–3, it should be noted that the fingers 30 should be unobstructed, at least for the portion of their length that will extend down into the rear housing 50.

The front housing 20 is then snap-fitted to the rear housing 50. To do so, the fingers 30 of the front housing 20 are aligned with cutouts 94 on the PCB 90 which are themselves aligned with the snap recesses 54 in the rear housing 50. The fingers 30 are pushed downwardly into these cutouts 94 until the snap teeth 32 engage the snap recesses 54, thereby mating the front housing 20 to the rear housing 50. If ribs 66, such as described above, are used, then the fingers 30 may conveniently extend through the cavities between ribs 66, otherwise appropriate notches will need to be present in the sidewalls 52 so as to allow the fingers 30 to properly reach the snap recesses 54.

Figure 2:
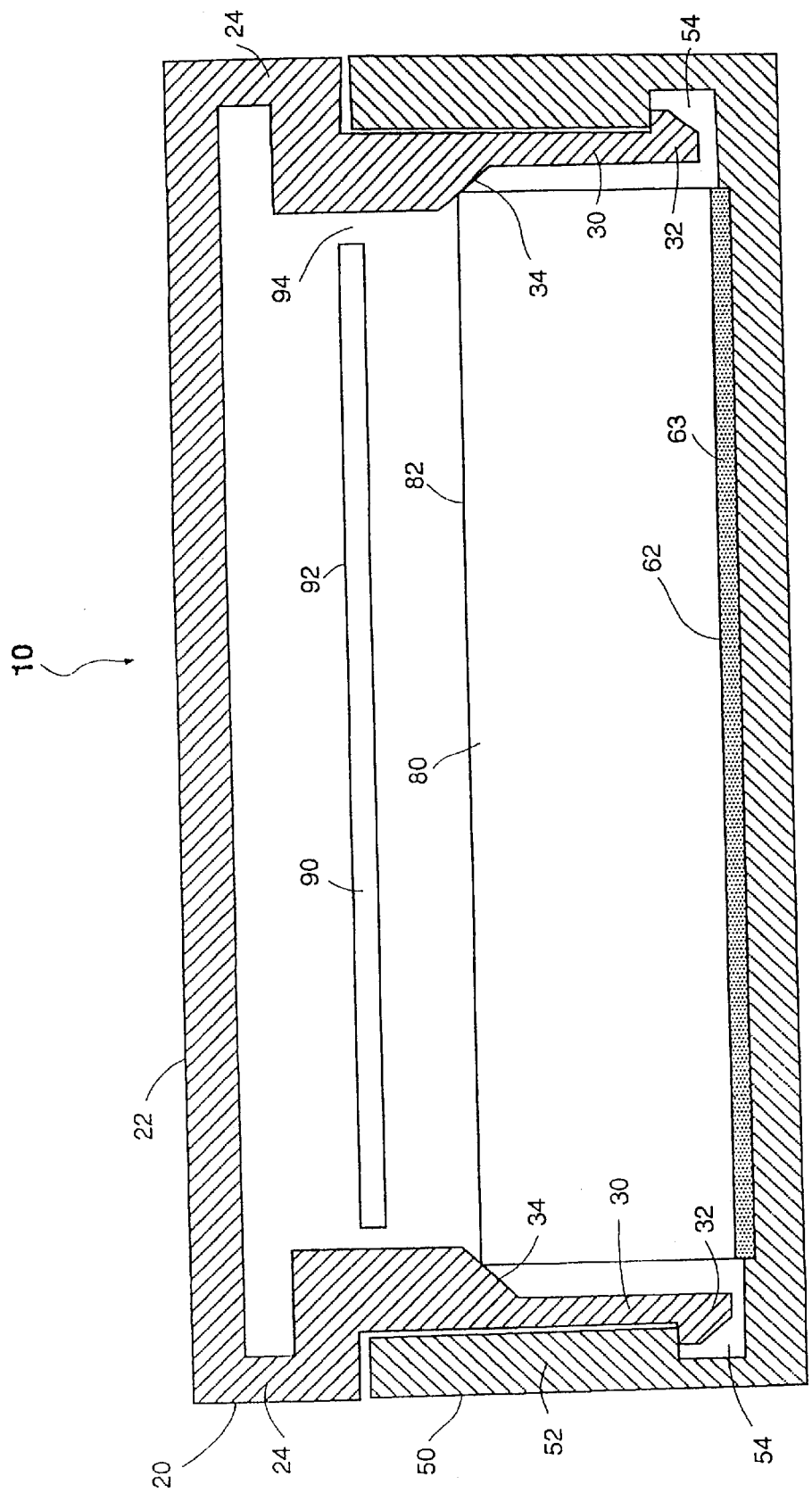
FIG. 2 is a sectional view along line II—II of the assembled enclosure of FIG. 1.
Figure 3:
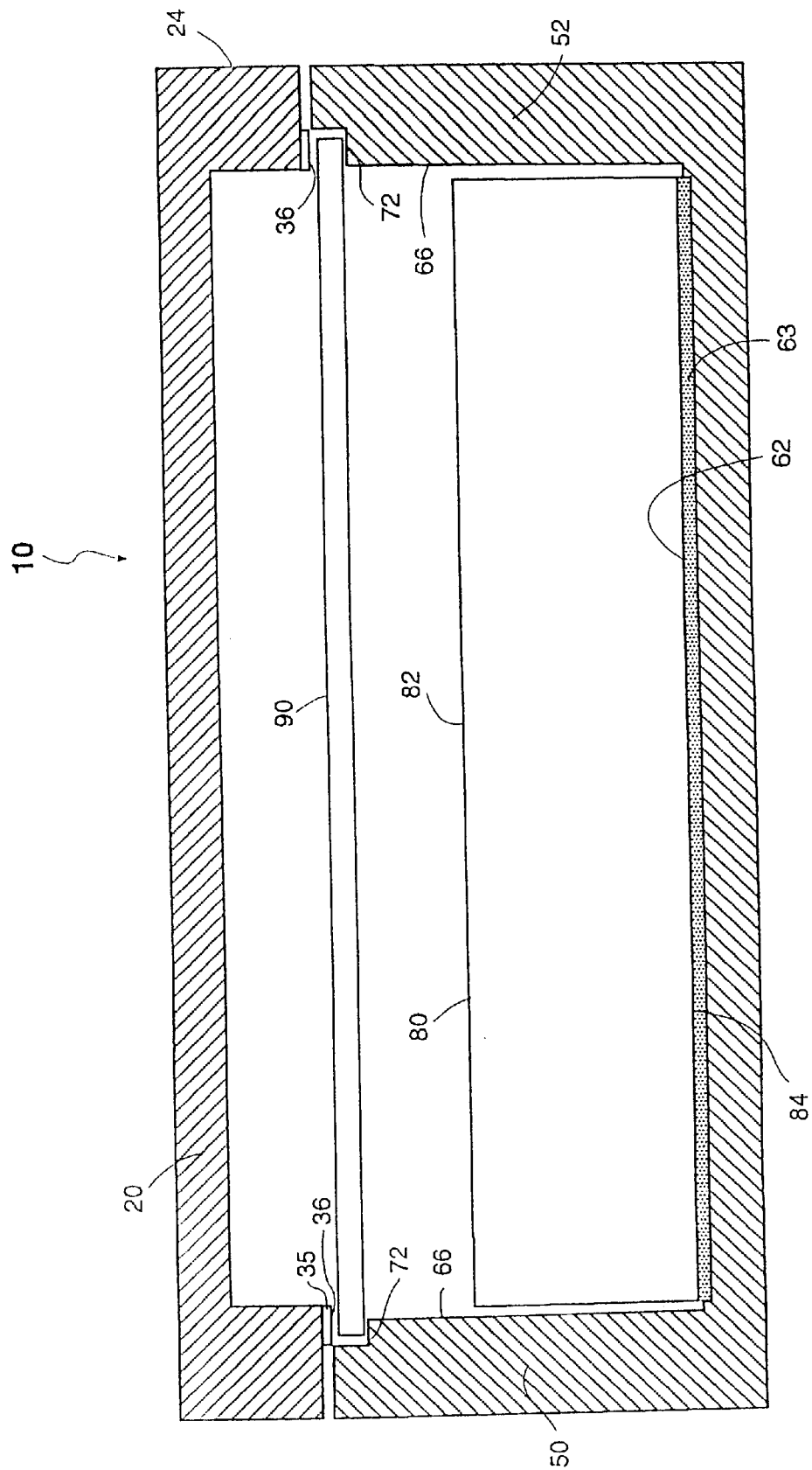
FIG. 3 is a sectional view along line III—III of the assembled enclosure of FIG. 1.

When the front housing 20 is mated to the rear housing 50, the holding surfaces 34,36 are brought into contact with the corresponding upper surfaces 82,92 respectively of the component layers, in this illustrative case, the battery pack 80 and the PCB 90. The housings 20,50, fingers 30, and holding surfaces 36 are configured so that the upper component layer 90 is gripped between the holding surfaces 36 and the rear housing 50. Note that this gripping may, but need not, be at opposing points on opposite sides of the component layer 80,90. For instance, the battery pack 80 of FIG. 2 is supported along its entire underside 84 by the rear housing 50. Therefore, the holding surfaces 34 contacting the battery pack 80 are necessarily directly opposed by a contact point (with the floor 62 of the well 60) lying directly underneath. On the other hand, the PCB 90 is supported at only selected locations, by the corresponding resting surfaces 72. These locations are not aligned along the x-axis with the corresponding holding surfaces 36. In other words, the PCB 90 is being pushed down at certain points along its perimeter and pushed up at others. The two sets of contact areas offset each other, thereby gripping the PCB 90 therebewteen, but they are not necessarily overlying one another.

The holding surfaces 34,36 may be flat horizontal ledges. However some of the holding surfaces 34,36 are preferably angled, such as the holding surfaces 34 contacting the battery pack 80 as shown in FIG. 2. One advantage of such a configuration is that the action of the holding surface 34 against the battery pack 80 not only pushes the battery pack 80 down, but also pushes the holding surface 34, and thus the entire finger 30, outwardly, thereby assisting in maintaining a proper snap fit.

In order to accommodate component layers 80,90 of varying thickness (e.g., thicker in some locations and thinner in others), it may be preferable that the holding surfaces 34,36 not be at a uniform altitude, but instead be at altitudes that vary according to the local thickness of the corresponding component layer 80,90. Alternatively, the appropriate resting surfaces 72 may be at a non-uniform altitude and/or the floor 62 may be contoured to match the variations in the corresponding component layers 80,90. Or, both the holding surfaces 34,36 and the resting surfaces 72 may be at a non-uniform altitudes.

In order to more securely grip the component layers 80,90, and to otherwise allow for tolerances, the holding surfaces 34,36 may include cushions 35. These cushions 35 should be of a softer material than the housings 20,50. For instance, the cushions 35 may be some form of second shot elastomer, such as santoprene, or may be a foam pad of any type known in the art. In addition, the floor 62 of the well 60 may also include a similar cushion 63.

The holding surfaces 34,36 may be portion of fingers 30, as described above, or may be a portion of the sidewall 24 itself, or both. See FIG. 3. The particular method chosen to provide the holding surfaces 34,36 is not important, and any suitable method may be used. However, the holding surfaces 34,36 must be a portion of the front housing 20, whether formed integrally therewith or attached thereto. In addition, the various holding surfaces 34,36 do not need to be a portion of the same feature of the front housing 20. For instance, one set of holding surfaces 34 may be portions of only some fingers 30, while the other set of holding surfaces 36 are portions of other fingers 30 or the front housing sidewall 24 itself, and these structures may be peripherally offset from one another. However, if multiple sets of fingers 30 are used, then more real estate on the PCB 90 may be undesirably consumed.

Figure 4:
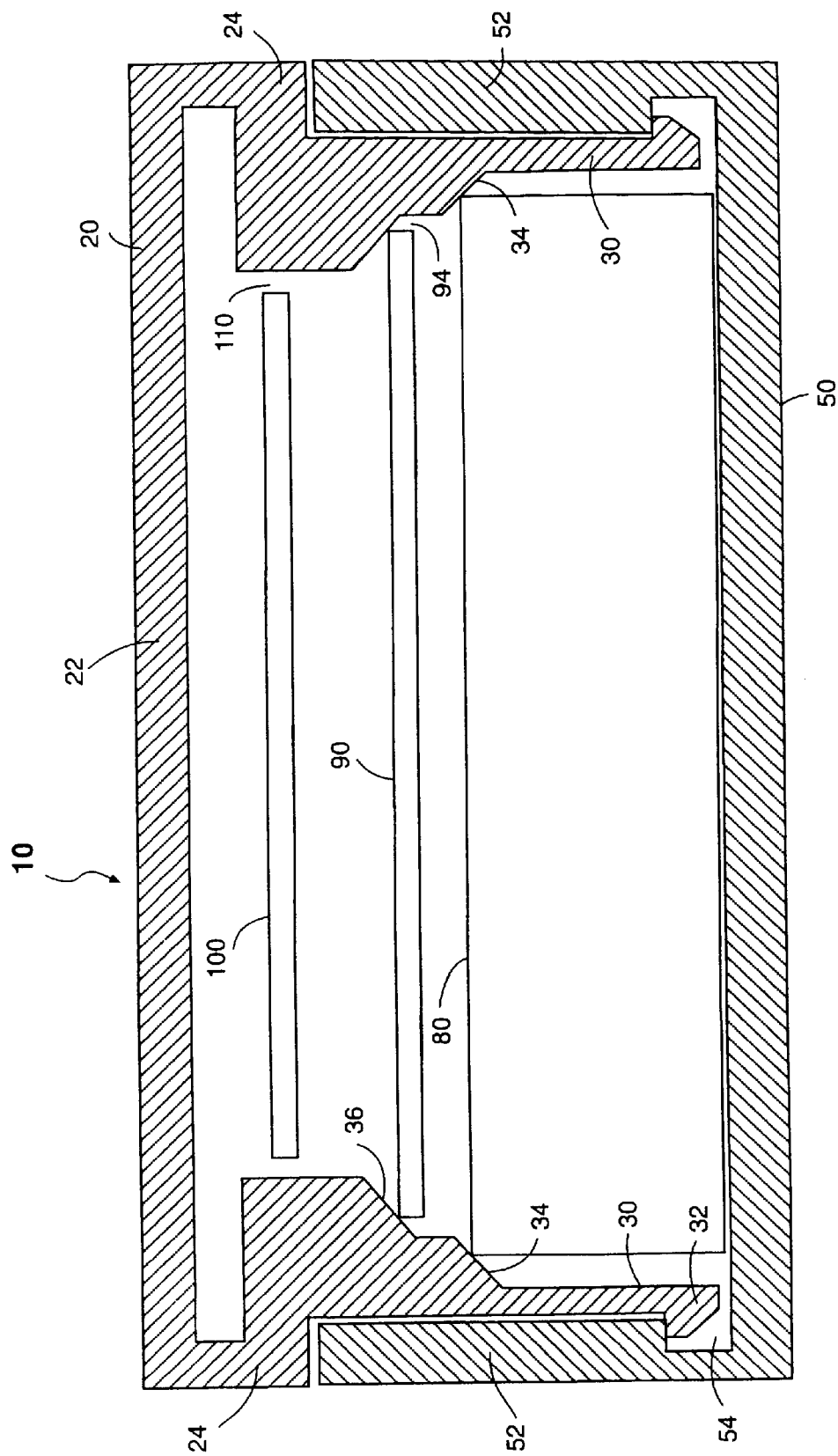
FIG. 4 is a sectional view similar to FIG. 2 of an assembled enclosure having three component layers.
Figure 5:
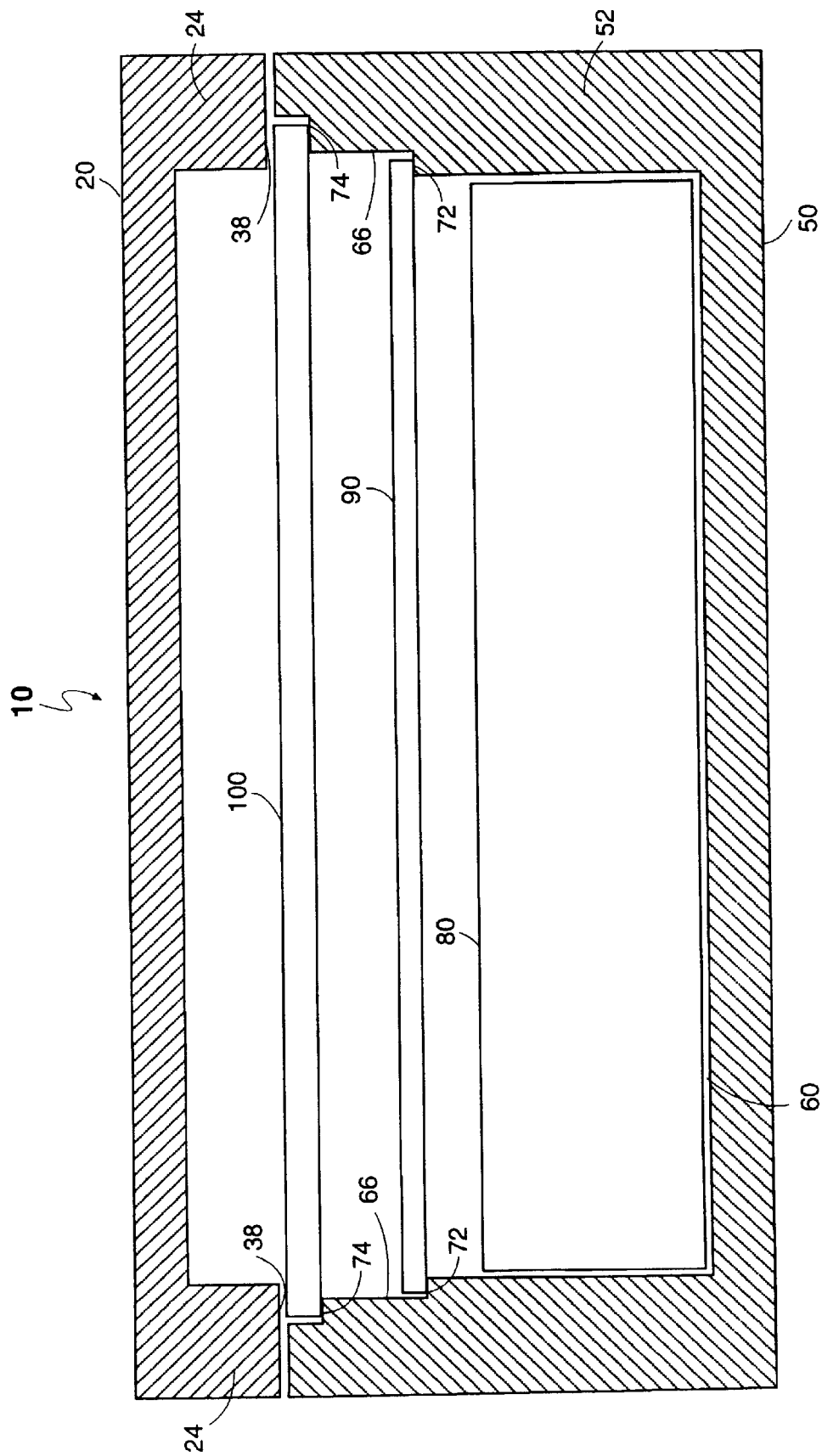
FIG. 5 is a sectional view similar to FIG. 3 of an assembled enclosure having three component layers.

Nor is the present invention limited to only two component layers 80,90. For instance, FIGS. 4-5 show how three component layers 80,90,100 may be handled. In this embodiment, a third set of holding surfaces 38 are integrated into the lower edge of the sidewall 24 of the front housing 20. In addition, a second set of resting surfaces 74 are integrated into the upper edge of the sidewall 52 of the rear housing 50 in a recessed step arrangement. The third component layer 100, in this case a second PCB 100, is disposed above the second component layer 90 and gripped by the second resting surfaces 74 and third holding surfaces 38. Because the second PCB 100 extends out to the sidewalls 52, and is therefore wider than the first PCB 90, it is necessary for the second PCB 100 to have larger peripheral cutouts 110 for the fingers 30 so that the second set of holding surfaces 36 may reach the first PCB 90. In other words, the upper PCB 100 will be wider than the lower PCB 90 in some locations, but narrower in others. By making suitable allowances for supporting ribs 66 and pressing fingers 30, configurations of more than three component layers may likewise be achieved.

The terms "upper," "lower," "front," "rear," etc. have been used herein merely for the convenience of the foregoing specification and the appended claims to describe the enclosure 10 of the present invention. It is to be understood, however, that these terms are in no way limiting to the invention since the wireless communications device enclosure 10 may obviously be disposed in many different positions when in actual use. In particular, the terms "front housing" 20 and "rear housing" 50 are not limited to what is conventionally viewed by a device user as the front and the rear, but are instead meant to refer to any two mated portions of the wireless communications device enclosure 10. Further, the term wireless communications device is not limited to only cellular phones, but instead encompasses cellular telephones, satellite telephones, personal communications devices, and the like which communicate with other devices at least partially via radiowaves transmitted through the air.

The present invention allows for wireless communications device to include fewer parts. While screws and the like may optionally be used to join the portions of the enclosure 10 together, screws and the like are not necessary to vertically hold the electronic component layers 80,90,100 within the enclosure 10. Such an approach allows for easier and less expensive assembly and may allow for thinner devices to be made.

The present invention may, of course, be carried out in other specific ways than those herein set forth without departing from the spirit and essential characteristics of the invention. The present embodiments are, therefore, to be considered in all respects as illustrative and not restrictive, and all changes coming within the meaning and equivalency range of the appended claims are intended to be embraced therein.

What is claimed is:

1. An enclosure for a wireless communications device, comprising:

a) a first housing section having a first set of holding surfaces and a second set of holding surfaces;

b) a second housing section connected to said first housing section;

c) a vertical axis defined from the direction of said second housing section to said first housing section;

d) a first component layer disposed between said first housing section and said second housing section and at least partially within said second housing section, said first component layer in direct contact with both said first set of holding surfaces and said second housing section and vertically trapped therebetween;

e) a second component layer disposed between said first housing section and said second housing section and above said first component layer, said second component layer in direct contact with both said second set of holding surfaces and said second housing section and vertically trapped therebetween.

2. The enclosure of claim 1 wherein said first component layer is a battery pack.

3. The enclosure of claim 1 wherein said second component layer is a printed circuit board having electrical components thereon.

4. The enclosure of claim 1 wherein each of said first set of holding surfaces includes a cushion.

5. The enclosure of claim 1 wherein each of said second set of holding surfaces includes a cushion and wherein said second component layer directly contacts said cushion.

6. The enclosure of claim 1 wherein said first housing section includes a plurality of downwardly extending fingers and wherein said fingers include at least one of said first set of holding surfaces and one of said second set of holding surfaces.

7. The enclosure of claim 1 wherein said second housing section includes a well having a floor and wherein said first component layer directly contacts said floor.

8. The enclosure of claim 7 wherein said floor includes a cushion and said first component layer directly contacts said cushion.

9. The enclosure of claim 1 wherein said first housing section includes a plurality of downwardly extending fingers and wherein said fingers include snaps on a lower portion thereof and wherein said snaps engage said second housing section so as to hold said first housing section and said second housing section together.

10. The enclosure of claim 1 where said first housing section and said second housing section are held together by screws.

11. The enclosure of claim 1 wherein said first housing section and said second housing section are held together by snap-fitting.

12. The enclosure of claim 1 wherein said second housing section includes a well having a plurality of peripheral ribs and wherein said ribs constrain the non-vertical movement of said first component layer.

13. The enclosure of claim 1 wherein said second housing section includes a first set of resting surfaces and said second component layer is in direct contact with said first set of resting surfaces and vertically trapped between said first set of resting surfaces and said second set of holding surfaces.

14. The enclosure of claim 1 wherein said first holding surfaces are at a uniform first vertical elevation.

15. The enclosure of claim 1 wherein there are at least three first holding surfaces.

16. The enclosure of claim 1 wherein either said first housing section or said second housing section further includes a third set of holding surfaces, and further including a third component layer disposed above said second component layer in direct contact with both said third set of holding surfaces and the other of said first or second housing sections and vertically trapped therebetween.

17. The enclosure of claim 1 wherein the wireless communications device is a cellular telephone.

18. The enclosure of claim 1 wherein:
a) said first component layer is a battery pack and said second component layer is a printed circuit board having electrical components thereon;
b) said first housing section includes a plurality of downwardly extending fingers, said fingers including at least one of said first set of holding surfaces and one of said second set of holding surfaces, said fingers further including a snap on a lower portion thereof for engaging said second housing section so as to hold said first housing section and said second housing section together; and
c) said second housing section further including a first set of resting surfaces and a well having a plurality of peripheral ribs, said ribs constraining the non-vertical movement of said first component layer, said first component layer directly contacting said floor; said second component layer directly contacting said first set of resting surfaces and vertically trapped between said first set of resting surfaces and said second set of holding surfaces.

19. The enclosure of claim 18 wherein either said first housing section or said second housing section further includes a third set of holding surfaces, and further including a third component layer disposed above said second component layer in direct contact with both said third set of holding surfaces and the other of said first or second housing sections and vertically trapped therebetween.

20. A method of securing multiple layers of electrical components in a wireless communications device, the wireless communications device having a first housing section and a second housing section and a vertical axis defined from the second housing section to the first housing section, comprising:
a) gripping a first component layer, so as to prevent substantial vertical movement thereof, between a first set of holding surfaces of the first housing section and the second housing section;
b) gripping a second component layer, so as to prevent substantial vertical movement thereof, between a second set of holding surfaces of the first housing section and the second housing section;
c) wherein, when said first and second housing sections are joined together, said first and second component layers are enclosed by said first and second housing sections and said second component layer is disposed above said first component layer.

21. The method of claim 20 wherein said first component layer is a battery pack.

22. The method of claim 20 wherein said second component layer is a printed circuit board having electrical components thereon.

23. The method of claim 20 wherein each of said first set of holding surfaces includes a cushion and wherein said first component layer directly contacts said cushion.

24. The method of claim 20 wherein each of said second set of holding surfaces includes a cushion.

25. The method of claim 20 wherein said first housing section includes a plurality of downwardly extending fingers and wherein each of said fingers includes one of said first set of holding surfaces and one of said second set of holding surfaces.

26. The method of claim 20 wherein said second housing section includes a well and wherein said well includes a floor and wherein said first component layer directly contacts said floor.

27. The method of claim 26 wherein said floor includes a cushion and said first component layer directly contacts said cushion.

28. The method of claim 26 wherein said well includes a plurality of peripheral ribs and wherein said ribs constrain the non-vertical movement of said first component layer.

29. The method of claim 20 wherein said first housing section includes a plurality of downwardly extending fingers and wherein said fingers include snaps on a lower portion thereof and wherein said snaps engage said second housing section so as to hold said first housing section and said second housing section together.

30. The method of claim 20 further including joining said first housing section and said second housing section together by screws.

31. The method of claim 20 further including joining said first housing section and said second housing section together by snap-fitting.

32. The method of claim 20 wherein said second housing section includes a first set of resting surfaces and wherein said gripping the first component layer includes establishing direct contact between said second component layer and said first set of resting surfaces.

33. The method of claim 20 wherein said first holding surfaces are at a uniform first vertical elevation.

34. The method of claim 33 wherein said second set of holding surfaces are at a uniform second vertical elevation.

35. The method of claim 20 where there are at least three first holding surfaces.

36. The method of claim 20 wherein either said first housing section or said second housing section further includes a third set of holding surfaces, and further including gripping said third component layer, so as to prevent substantial vertical movement thereof, between said third set of holding surfaces and the other of said first or second housing sections.

37. The method of claim 20:
a) wherein said first component layer is a battery pack and said second component layer is a printed circuit board having electrical components thereon;
b) wherein said first housing section includes a plurality of downwardly extending fingers, said fingers including at least one of said first set of holding surfaces and one of said second set of holding surfaces;
c) wherein said second housing section includes a first set of resting surfaces and a well having a plurality of peripheral ribs, said ribs constraining the non-vertical movement of said first component layer;
d) wherein said gripping of said first component layer includes establishing direct contact between said first component layer and said floor;
e) wherein said gripping of said second component layer includes establishing direct contact between said first set of resting surfaces and said second set of holding surfaces; and
f) further including joining said first housing section and said second housing section together by snap-fitting.

38. The method of claim 37 wherein either said first housing section or said second housing section further includes a third set of holding surfaces, and further including gripping said third component layer, so as to prevent substantial vertical movement thereof, between said third set of holding surfaces and the other of said first or second housing sections.

* * * * *